United States Patent
Cutler et al.

(10) Patent No.: US 12,455,507 B2
(45) Date of Patent: Oct. 28, 2025

(54) METHOD FOR REMOVING MATERIAL OVERBURDEN VIA ENHANCED FREEZE-LESS ANTI-SPACER FORMATION USING A BILAYER SYSTEM

(71) Applicant: Tokyo Electron Limited, Tokyo (JP)

(72) Inventors: Charlotte Cutler, Hopkinton, MA (US); Michael Murphy, Latham, NY (US)

(73) Assignee: Tokyo Electron Limited, Tokyo (JP)

( * ) Notice: Subject to any disclaimer, the term of this patent is extended or adjusted under 35 U.S.C. 154(b) by 582 days.

(21) Appl. No.: 17/831,047

(22) Filed: Jun. 2, 2022

(65) Prior Publication Data

US 2022/0388232 A1    Dec. 8, 2022

Related U.S. Application Data

(60) Provisional application No. 63/195,756, filed on Jun. 2, 2021.

(51) Int. Cl.
*G03F 7/40* (2006.01)
*B29C 71/00* (2006.01)

(52) U.S. Cl.
CPC ............ *G03F 7/40* (2013.01); *B29C 71/0009* (2013.01); *G03F 7/405* (2013.01); *B29K 2995/0059* (2013.01)

(58) Field of Classification Search
CPC . G03F 7/40; G03F 7/405; G03F 7/004; H01L 21/0271
See application file for complete search history.

(56) References Cited

U.S. PATENT DOCUMENTS

| | | |
|---|---|---|
| 7,314,691 B2 | 1/2008 | Hata et al. |
| 7,604,911 B2 | 10/2009 | Hata et al. |
| 8,492,282 B2 | 7/2013 | DeVilliers |
| 8,871,646 B2 | 10/2014 | DeVilliers |

(Continued)

FOREIGN PATENT DOCUMENTS

| | | |
|---|---|---|
| KR | 10-2008-0039006 A | 5/2008 |
| TW | 201527872 A | 7/2015 |
| TW | 201541503 A | 11/2015 |

OTHER PUBLICATIONS

International Search Report and Written Opinion issued on Sep. 21, 2022 in PCT/US2022/031123 filed on May 26, 2022, 8 pages.

(Continued)

*Primary Examiner* — Jonathan Johnson
*Assistant Examiner* — Alexander N. Lee
(74) *Attorney, Agent, or Firm* — Oblon, McClelland, Maier & Neustadt, L.L.P.

(57) ABSTRACT

Techniques herein include methods of patterning a substrate using surface energy differences found in some fluorinated polymers or polymers with long chain alkyl functionality that promotes surface or top layer segregation in a bilayer polymer system to facilitate overburden removal when the polymer mixture is deposited over a relief pattern. The method allows for fast removal of the overburden to expose the anti-spacer region which, after acid diffusion and subsequent deprotection, is also soluble in a developer. Incorporating the highly developer-soluble polymer at the top of the top layer removes the need for the remaining polymer to have a specific dissolution rate in developer.

18 Claims, 9 Drawing Sheets

(56) References Cited

U.S. PATENT DOCUMENTS

| | | |
|---|---|---|
| 8,906,598 B2 | 12/2014 | Kozawa et al. |
| 9,406,526 B2 | 8/2016 | DeVilliers |
| 11,747,733 B2* | 9/2023 | Murphy .................. G03F 7/091 |
| | | 430/324 |
| 2014/0273513 A1 | 9/2014 | Mita et al. |
| 2016/0013041 A1* | 1/2016 | Liu ......................... G03F 7/425 |
| | | 438/703 |
| 2018/0118968 A1* | 5/2018 | Kaur ..................... G03F 7/2041 |
| 2020/0105522 A1* | 4/2020 | Liu ........................... G03F 7/40 |

OTHER PUBLICATIONS

Search Report and Office Action in Taiwanese Patent Application No. 111119981 issued by the Taiwanese IPO on Jul. 31, 2025, with English translation, citing document Nos. 1, 15 and 16, 8 pages.

* cited by examiner

METHOD FOR REMOVING MATERIAL OVERBURDEN VIA ENHANCED FREEZE-LESS ANTI-SPACER FORMATION USING A BILAYER SYSTEM

CROSS REFERENCE TO RELATED APPLICATIONS

This present disclosure claims the benefit of U.S. Provisional Application No. 63/195,756, filed on Jun. 2, 2021, which is incorporated herein by reference in its entirety.

FIELD OF THE INVENTION

The present disclosure relates to a method of semiconductor fabrication, and particularly to using surface energy differences found in some fluorinated polymers or polymers with long chain alkyl functionality that promotes surface or top layer segregation in a bilayer polymer system to facilitate overburden material removal coated on structures.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In material processing methodologies (such as photolithography), creating patterned layers typically involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithographic exposure system. This exposure creates a latent pattern within the radiation-sensitive material which can then be developed. Developing refers to dissolving and removing a portion of the radiation-sensitive material to yield a relief pattern (topographic pattern). The portion of material removed can be either irradiated regions or non-irradiated regions of the radiation-sensitive material depending on a photoresist tone and/or type of developing solvent used. The relief pattern can then function as a mask layer defining a pattern.

Preparation and development of various films used for patterning can include thermal treatment or baking. For example, a newly applied film can receive a post-application bake (PAB) to evaporate solvents and/or to increase structural rigidity or etch resistance. Also, a post-exposure bake (PEB) can be executed to set a given pattern to prevent further dissolving. Fabrication tools for coating and developing substrates typically include one or more baking modules. Some photolithography processes include coating a substrate with a thin film of Bottom Anti-reflective Coating (BARC), followed by coating with a resist, and then exposing the substrate to a pattern of light as a process step for creating microchips. A relief pattern created can then be used as a mask or template for additional processing such as transferring the pattern into an underlying layer.

The relief pattern can be covered by a deposited material that fills in trenches for eventual spacer formation. The deposited material can further be modified to adjust the dimensions for the eventual spacers. However, to develop the deposited material that has been modified, an overburden of the deposited may need to be removed to access the modified portions. However, some soft materials cannot withstand etch or chemical mechanical polish processes. Thus, a method for removing overburden without affecting the underlying material or introducing alterations to the dimensions of the modified material is desired.

SUMMARY

The present disclosure relates to a method of patterning a substrate, including forming a relief pattern including relief structures on a substrate from a first layer of photoresist on the substrate, the first layer of photoresist including a first solubility-shifting agent and a second solubility-shifting agent, the photoresist having a sensitivity to the first solubility-shifting agent and the second solubility-shifting agent, the relief pattern formed by activating the first solubility-shifting agent using a pattern of actinic radiation and developing the first layer of photoresist; depositing a polymer mixture on the relief structures, the polymer mixture filling openings defined by the relief pattern and covering the relief structures, a region above top surfaces of the relief structures being an overburden region, the polymer mixture including a first polymer and a second polymer, the polymer mixture being configured to self-segregate relative to gravity such that a first film and a second film are formed from the polymer mixture, the first film including the first polymer formed below the second film including the second polymer, the first film and the second film formed such that the second film fills the overburden region, the first film being sensitive to the second solubility-shifting agent and having a threshold of sensitivity that is less than a threshold of sensitivity of the photoresist, the second film being soluble to a first developer; activating the second solubility-shifting agent and diffusing the second solubility-shifting agent a predetermined diffusion length from the relief structures into the first film, the second solubility-shifting agent activated sufficiently to meet the threshold of sensitivity of the first film without meeting the threshold of sensitivity of the photoresist, diffusion regions formed in the first film becoming soluble to the first developer while the photoresist remains insoluble to the first developer; and developing the substrate to remove the second film and the soluble diffusion regions of the first film.

The present disclosure additionally relates to a method of patterning a substrate, including forming a relief pattern including relief structures on a substrate from a first layer of photoresist on the substrate, the first layer of photoresist including a first solubility-shifting agent and a second solubility-shifting agent, the photoresist having a sensitivity to the first solubility-shifting agent and the second solubility-shifting agent, the relief pattern formed by activating the first solubility-shifting agent using a pattern of actinic radiation and developing the first layer of photoresist; depositing a resin overcoat on the relief structures, the resin overcoat filling openings defined by the relief pattern and covering the relief structures, a region above top surfaces of the relief structures being an overburden region, the resin overcoat having a resin mixture including a first resin and a second resin, the resin overcoat being configured to self-segregate relative to gravity such that a first film and a second film are formed from the resin overcoat, the first film including the first resin formed below the second film including the second resin, the first film and the second film formed such that the second film fills the overburden region, the first film being sensitive to the second solubility-shifting agent and having a threshold of sensitivity that is less than a threshold of sensitivity of the photoresist, the second film being soluble to a first developer; activating the second solubility-shifting agent and diffusing the second solubility-shifting agent a predetermined diffusion length from the relief structures into the first film, the second solubility-shifting agent activated sufficiently to meet the threshold of sensitivity of the first film without meeting the threshold of sensitivity of the photoresist, diffusion regions formed in the first film becoming soluble to the first developer while the photoresist remains insoluble to the first developer; and developing the substrate to remove the second film and the soluble diffusion regions of the first film.

The present disclosure additionally relates to a method of patterning a substrate, including receiving a substrate having features defining openings to be partially filled; depositing a polymer mixture on the substrate, the polymer mixture filling openings defined by the features and covering the features, a region above top surfaces of the features being an overburden region, the polymer mixture including a first polymer and a second polymer, the polymer mixture being configured to self-segregate relative to gravity such that a first film and a second film are formed from the polymer mixture, the first film including the first polymer formed below the second film including the second polymer, the first film and the second film formed such that the first film partially fills the defined openings while the second film fills remaining portions of the defined openings and fills the overburden region, the second film being sensitive to a particular solvent while the first film is insoluble to the particular solvent; and developing the substrate with the particular solvent to remove the second film, the first film remaining in the defined openings Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1A:
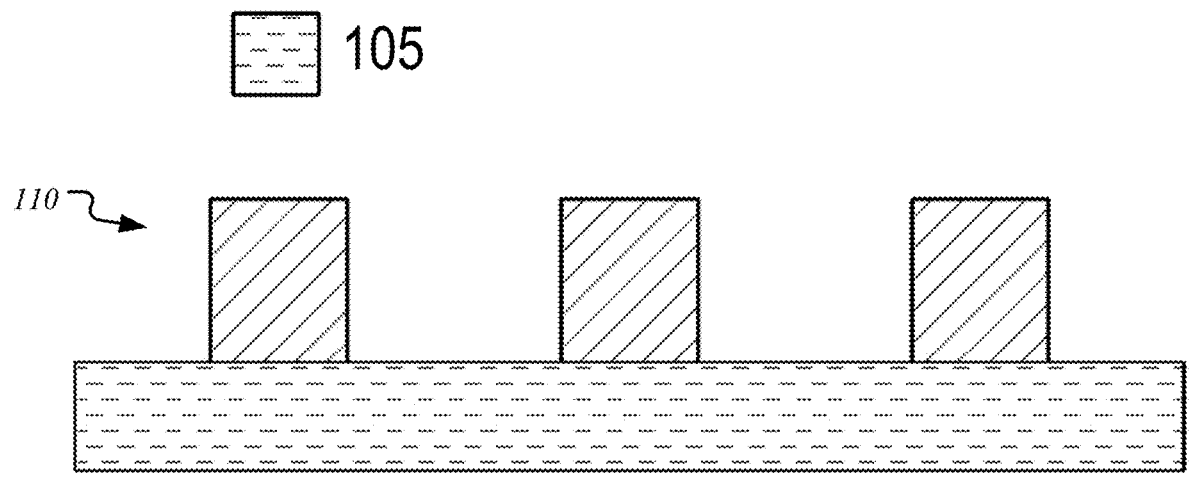
FIG. 1A is a cross-sectional substrate segment illustrating a substrate including a relief pattern, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Ever continuous scaling requires improved patterning resolution. One approach can leverage spacer technology to define a sub-resolution line feature via atomic layer deposition (ALD). One challenge, however, is that if the opposite tone feature is desired, using spacer techniques can be complex involving over-coating another material, chemical mechanical planarization (CMP), and reactive ion etch (ME) to exhume the spacer material, leaving a narrow trench, which can be costly.

Anti-spacer is a self-aligned technology that uses the diffusion length of a reactive species to define a critical dimension (CD), creating a narrow trench. With a reactive species controlled spatially via exposure through a mask, instead of a narrow trench being formed, a narrow slot contact can be formed. Instead of spatial control, reactive species can be controlled uniformly across a wafer by decomposition of a thermal acid generator (TAG) via a bake process. A corresponding CD can be tuned through molecular weight modification of the reactive species, molecular structure of the reactive species, and the bake temperature and bake time. Additionally, the CD can be controlled by the composition of the material the reactive species is diffusing into. The polarity of components within the resin (the material the reactive species is diffusing into) can affect acid diffusivity and the activation energy of the reactive species-sensitive component of the material, which is an additional means to control processing. These techniques enable access to narrow slot contact features at dimensions beyond the reach of advanced lithographic capabilities. However, processing can include a freeze step. The freeze step can be a treatment that neutralizes a solubility shifting potential of a layer having an acid generator. Freeze processing, however, can introduce defects or errors and can reduce throughput.

Previously described anti-spacer flows used a thermal freeze process in which a de-protected photoresist mandrel is inhibited from solubilizing in the aqueous developer used to remove the de-protected (or de-crosslinked or otherwise changed in solubility) overcoat and reveal the anti-spacer feature. The incorporation of thermal freeze functionality into a photoresist can increase difficulty due to the stringent requirements for high volume manufacturing and the reactive environment of the polymer resin.

To this end, U.S. Application No. 63/135,217, "Freeze-less Anti-spacer Formation by Contrast Selectivity" describes a technique of forming sub-resolution anti-spacer features without the need for a thermal freeze, that is, a "freeze-less" anti-spacer method, which is incorporated herein by reference in its entirety. Described therein is a method to form sub-resolution anti-spacer features below the de-protection threshold of the photoresist mandrel required to achieve solubility in an aqueous developer. The innate dissolution contrast of the overcoat is paired with a photoresist mandrel such that the solubility of the overcoat may be altered to form the anti-spacer while the photoresist remains relatively or sufficiently insoluble in the developing solution. This process provides a means to circumvent a need for a thermal freeze step to prevent dissolution of the photoresist mandrel. Therefore, no additional TAG is required in the mandrel formulation.

The process in the incorporated disclosure has improved patterning benefits, but this process includes the removal of an overburden of a resin overcoat. The overburden is the amount of fill material above top surfaces of the mandrels or top surfaces of the relief pattern (see below). The overburden can be removed to access or uncover the anti-spacer features for pattern transfer or continued patterning.

Techniques herein enhance this anti-spacer formation method by using a polymer mixture overcoat that self-segregates into a bilayer polymer system. A first polymer fills spaces below top surfaces of the relief pattern, while a second polymer assembles above top surfaces of the relief pattern. After formation of anti-spacer features by acid diffusion, the second polymer can be easily removed with a developer without affecting the first polymer or the relief pattern.

Described herein are techniques for using surface energy differences found in some fluorinated polymers or polymers with long chain alkyl functionality to promote surface layer (or upper film) segregation in a bilayer polymer system. Accordingly, an overburden of a fill material for anti-spacer formation can be easily be removed to access features created by diffusion length defined deprotection regions.

To this end, FIG. 1A is a cross-sectional substrate segment illustrating a substrate 105 including a relief pattern 110, according to an embodiment of the present disclosure. In an embodiment, the relief pattern 110 can be formed on a surface of the substrate 105. For example, a photolithography process can be used, wherein a layer of a photoresist material can be imaged and developed into the relief pattern 110. The relief pattern 110 can result in, for example after the developing, a mandrel 110a. A plurality of the mandrel 110a can also form the relief pattern 110, depending on the desired final features. Notably, the mandrel 110a can include a width and a height, wherein the height of the mandrel 110a can be defined by a distance measured from the surface of the substrate 105 to a top of the mandrel 110a.

Figure 1B:
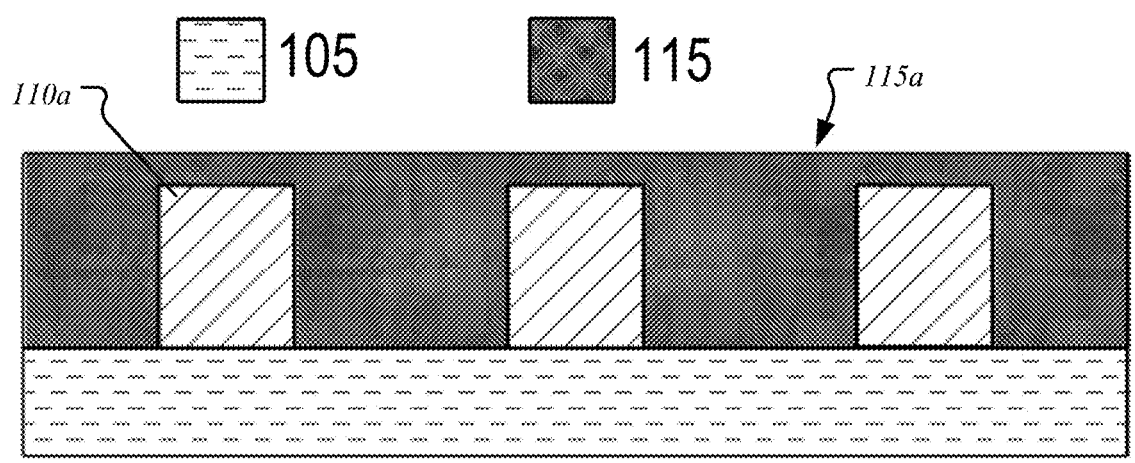
FIG. 1B is a cross-sectional substrate segment illustrating deposition of a material over the relief pattern, according to an embodiment of the present disclosure.

FIG. 1B is a cross-sectional substrate segment illustrating deposition of a material over the relief pattern 110, according to an embodiment of the present disclosure. In an embodiment, an overcoat 115a can be deposited over the relief pattern 110 via, for example, a spin coating process. Other non-limiting examples of coating processes can include dip coating, flow coating, spray coating, or the like, among others. The deposited material can be, for example, a resin or polymer 115. Notably, an excess of the deposited resin/polymer 115 can result in some amount of the resin/polymer 115 coated overtop the top of the mandrel 110a. This excess can be defined as an overburden. It may be necessary to remove the overburden in order to expose the top of the mandrel 110a for further processing. For example, a CMP process can be used to physically remove the overburden of the overcoat 115a and planarize the overcoat 115a. However, a process like CMP may not be able to achieve removal of the overcoat 115a material in between the mandrels 110a without decreasing the overall height of the relief pattern 110.

Figure 1C:
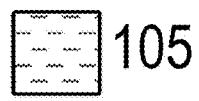
FIG. 1C is a cross-sectional substrate segment illustrating modification of the overcoat, according to an embodiment of the present disclosure.
Figure 1C:
Figure 1C:
Figure 1C:
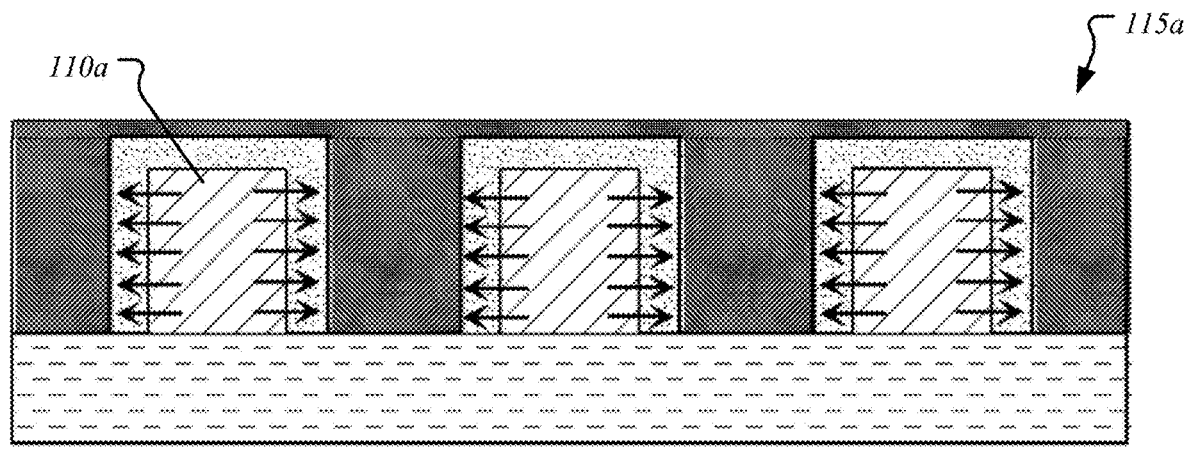

FIG. 1C is a cross-sectional substrate segment illustrating modification of the overcoat 115a, according to an embodiment of the present disclosure. In an embodiment, the relief pattern 110 material can include an acid and the acid can diffuse out from the relief pattern 110 into the surrounding overcoat 115a and form soluble regions 120. That is, the acid can modify the resin/polymer 115 and cause a solubility shift. Notably, the diffusion length may not fully change the solubility of the overburden above the top surfaces of the mandrels 110a depending on a formulation of the polymer mixtures. Thus, an extra process step may be performed to remove this insoluble overburden prior to accessing the anti-spacer narrow openings (trenches), such as the CMP described above. Even if the overcoat 115a has partial solubility in a predetermined developer, this can still inhibit complete spacer formation. If the solubility of the overcoat 115a is increased, then the trench and CD uniformity across the wafer (the substrate 105) may show more change than desired. This can also depend on topography of the substrate 105 and dimensions targeted to be accessed.

Figure 1D:
FIG. 1D is a cross-sectional substrate segment illustrating development results, according to an embodiment of the present disclosure.
Figure 1D:
Figure 1D:
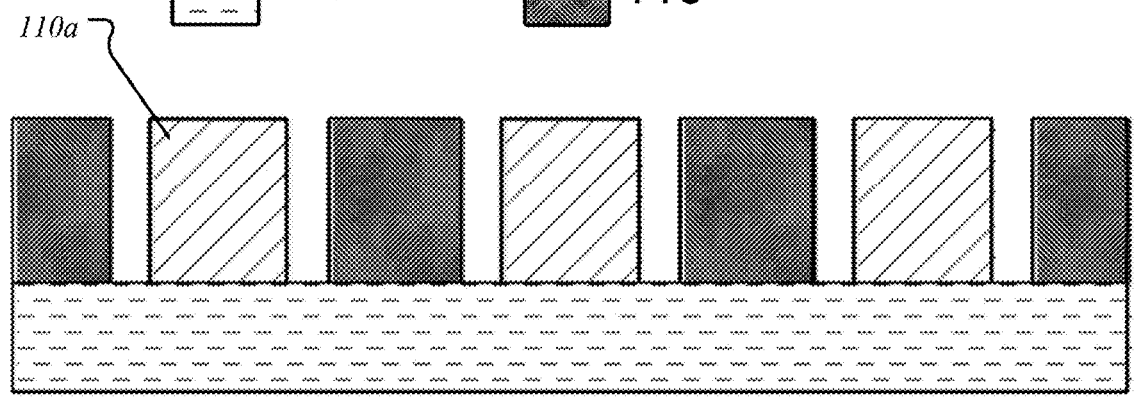

FIG. 1D is a cross-sectional substrate segment illustrating development results, according to an embodiment of the present disclosure. In an embodiment, a developer can remove the soluble regions 120 of the overcoat 115a after uncovering the soluble regions 120. As shown in FIG. 1D, narrow openings or anti-spacers can be defined by the diffusion length of the acid that results in the solubility shift of the resin/polymer 115.

Figure 1E:
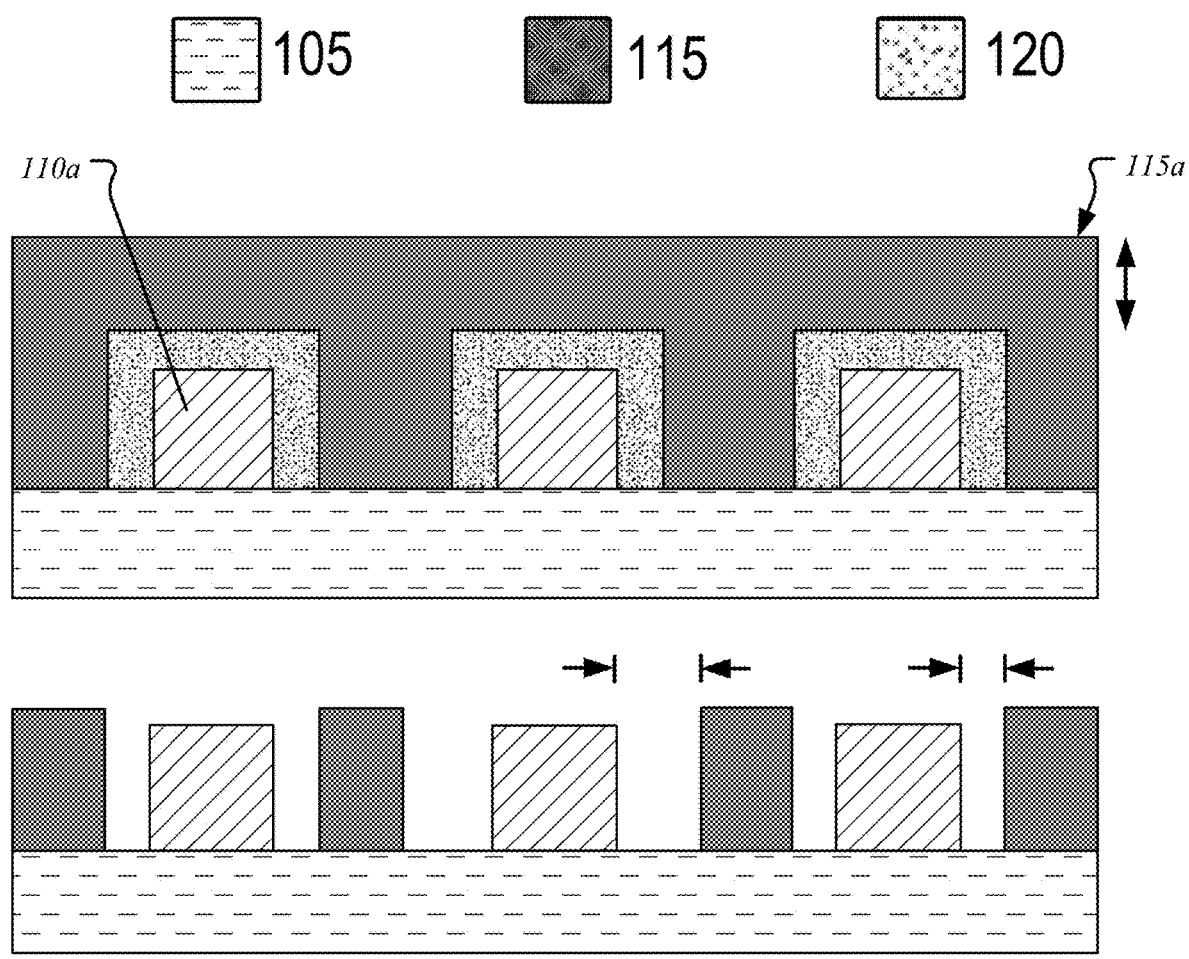
FIG. 1E is a cross-sectional substrate segment illustrating development factors, according to an embodiment of the present disclosure.

FIG. 1E is a cross-sectional substrate segment illustrating development factors, according to an embodiment of the present disclosure. In an embodiment, overburden height and time to clear out an anti-spacer trench can define the development time. As such, excess development time will widen the anti-spacer trench, and thus a low dissolution rate can provide a greater process window. As shown, a height of the mandrels 110a is not level with a height of the remaining overcoat 115a. Notably, a bilayer overcoat can help improve across-wafer uniformity in comparison to a single polymer overcoat in the anti-spacer process flow.

Described herein is a method of patterning a substrate and forming anti-space features wherein a step to remove overburden if facilitated by a polymer mixture overcoat that self-segregates into a bilayer polymer system.

Figure 2A:
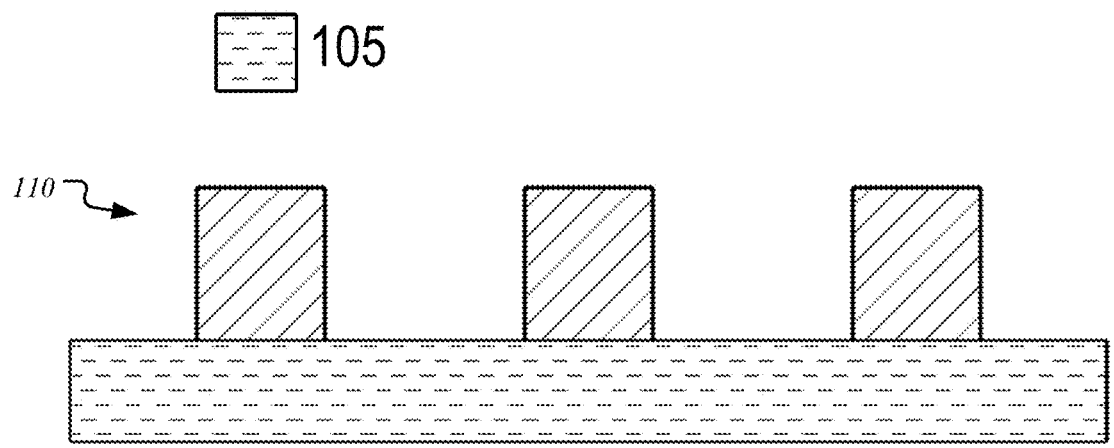
FIG. 2A is a cross-sectional substrate segment illustrating the substrate including the relief pattern, according to an embodiment of the present disclosure.

To this end, FIG. 2A is a cross-sectional substrate segment illustrating the substrate 105 including the relief pattern 110, according to an embodiment of the present disclosure. In an embodiment, similar to the previous description, a layer of photoresist can be deposited, imaged, and developed into the relief pattern 110.

Figure 2B:
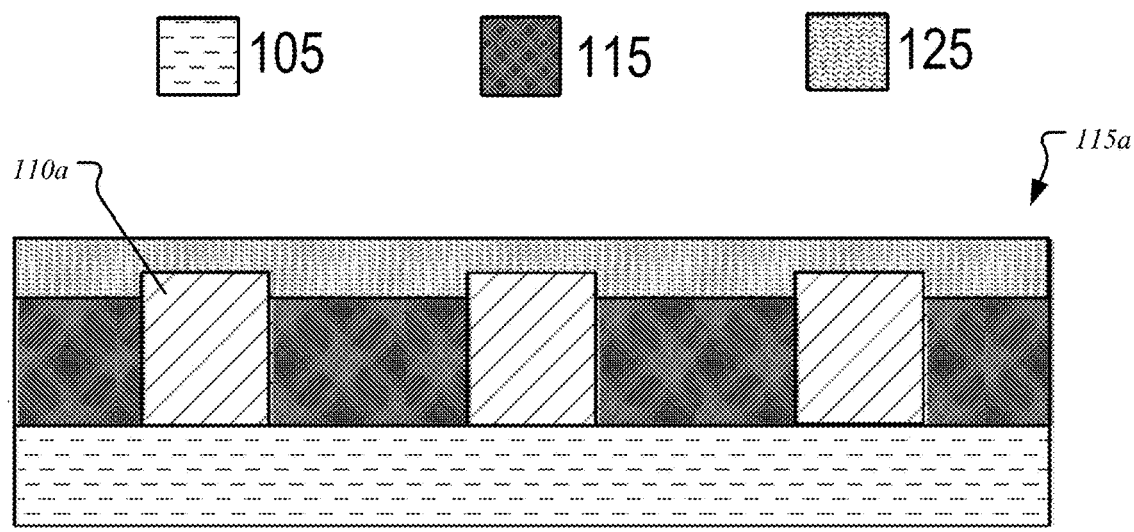
FIG. 2B is a cross-sectional substrate segment illustrating deposition of a material over the relief pattern, according to an embodiment of the present disclosure.

FIG. 2B is a cross-sectional substrate segment illustrating deposition of a material over the relief pattern 110, according to an embodiment of the present disclosure. In an embodiment, the overcoat 115a can be deposited over the relief pattern 110 via, for example, a spin coating process. Other non-limiting examples of coating processes can include dip coating, flow coating, spray coating, or the like, among others. Here, the deposited material can be, for example, a resin or polymer mixture. The polymer mixture can include, for example, the resin/polymer 115 and a high solubility resin/polymer 125 as a first resin/polymer and a second resin/polymer in the mixture, respectively. Non-limiting examples of the high solubility resin/polymer 125 can include HFIP-M, MA-MIB-HFA, MA-BTHB-OH, MA-3,5-HFA-CHOH, MA-BTHB-NB, MA-EATf, and MA-DM-EATf, among others. Non-limiting examples of the resin/polymer 115 can include any type of methacrylate or phenolic polymer with inverse solubility to the mandrel 110a material. The overcoat 115 can fill openings defined by the relief pattern 110 as well as cover the relief pattern 110. Notably, an excess of the deposited polymer mixture can again result in the overburden covering the top of the mandrel 110a.

In an embodiment, the polymer mixture can be configured to self-segregate or self-assemble. For example, the polymer mixture can self-segregate relative to gravity or perpendicular to a plane of the surface of the substrate 105. The self-segregation can occur after deposition without any activation, or an activation step can be used based on a composition of the polymer mixture. For example, a baking step can be used for thermal activation. The self-segregation can result in a bilayer or two-layer film. FIG. 2B shows the bilayer film after self-segregation, including the resin/polymer 115 film disposed below the high solubility resin/polymer 125 film. The composition of each film can have different properties. For example, the lower resin/polymer 115 film can be configured to provide good etch resistivity. For example, the lower resin/polymer 115 film can have very low or no solubility in TMAH unless an ester protective group is present and deprotection has occurred in the presence of an acid. Conversely, the upper high solubility resin/polymer 125 film can have very high solubility in, for example, the TMAH. The lower resin/polymer 115 film can also be configured to change a solubility at a lower threshold of acid or other agent as compared to a photoresist material. Depending on materials selected for use and a given concentration in formulation, in situ polymer segregation of 10-30 Angstroms or more can be achieved in the upper high solubility resin/polymer 125 film.

Notably, in an embodiment, the relative amounts of the first polymer and the second polymer (e.g., the resin/polymer 115 and the high solubility resin/polymer 125) can be configured such that there is sufficient material of the second polymer for the overburden region to be composed of the second polymer. The second polymer film can even extend below the top surfaces of the mandrels 110a in the relief pattern 110. The second polymer film or the upper polymer layer can be configured differently than the first polymer layer. The second polymer layer can be configured to be soluble in a predetermined developer or solvent without an agent needing to shift a solubility. The polymer mixture formulation therefore facilitates easier removal of the upper film or overburden, thereby uncovering the relief pattern 110 and potentially a portion of the lower resin/polymer 115 film.

Figure 2C:
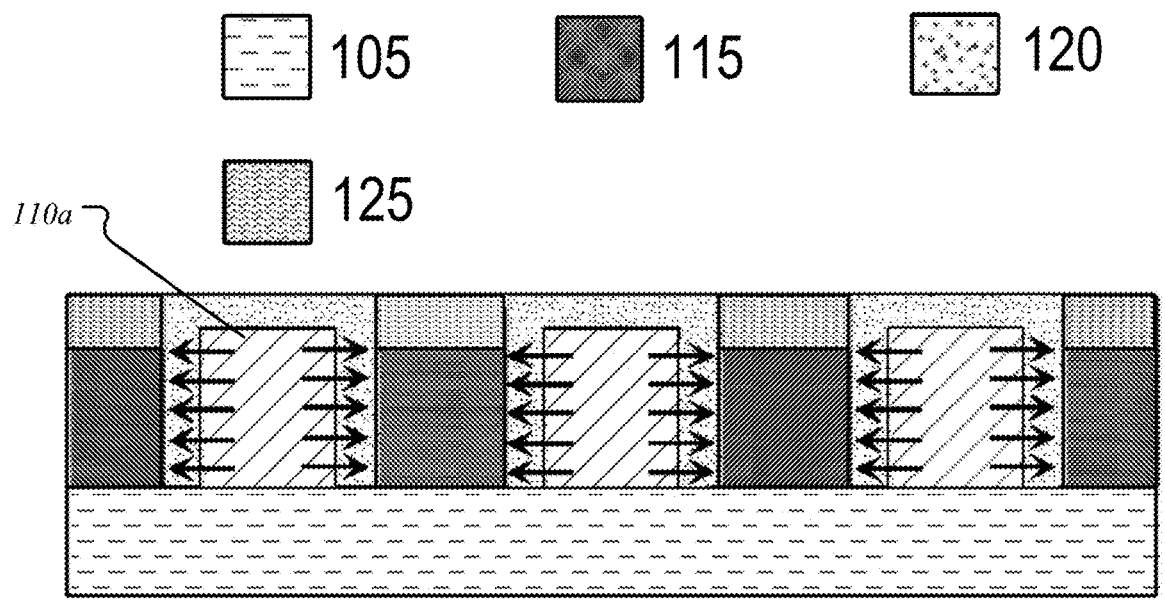
FIG. 2C is a cross-sectional substrate segment illustrating acid diffusion, according to an embodiment of the present disclosure.

FIG. 2C is a cross-sectional substrate segment illustrating acid diffusion, according to an embodiment of the present disclosure. In an embodiment, the upper segregated high solubility resin/polymer 125 can be designed to have a relatively high dissolution rate in a predetermined developer. This can enable very fast removal of the overburden to uncover the anti-spacer region. After acid diffusion to form the soluble regions 120 and subsequent de-protection, the anti-spacer region can also be soluble in a predetermined developer. The acid diffusion length or distance can be precisely controlled by bake time, temperature, and other factors. Incorporating the high solubility resin/polymer 125 at the top of the overcoat's 115a bilayer arrangement can remove the need for the remaining polymer to have a specific dissolution rate in developer and thus can be easier to match etch selectivity and platform type with the polymer in the first, lower film.

Removal of the overburden can enable access to anti-spacer regions, shown where arrowheads appear in FIG. 2C. The high solubility resin/polymer 125 can use a specific developer dissolution rate to develop the anti-spacer, while maintaining a desired aspect ratio of the lines formed. Another property of the lower resin/polymer 115 film can be having different etch selectivity. It can be preferable that the etch selectivity of the lower resin/polymer 115 film and the mandrel 110a material be similar in order to optimize the etch transfer into the underlayer. Further, in an embodiment, the high solubility resin/polymer 125 may need no etch selectivity. To alleviate some of the challenges for the lower film selectivity, a small amount of a blend polymer can be used in the upper high solubility resin/polymer 125 film. The blend polymer can be selected to be chemically different from the main polymer, in that a surface energy of the blend polymer can enable it to segregate to the top of the film during coating, for example, spin coating. The blend polymer can also have high developer solubility without the need for etch selectivity. Segregating polymer films to create monolayers in top coats for 193 nm immersion lithography can result in a very thin film, as well as forming bulk heterojunctions for exciton separation in photovoltaic devices. For embodiments described herein, a thicker layer of high solubility resin/polymer 125 can migrate to the surface at a similar thickness as the overburden for the lower resin/polymer 115 film formulation.

Figure 2D:
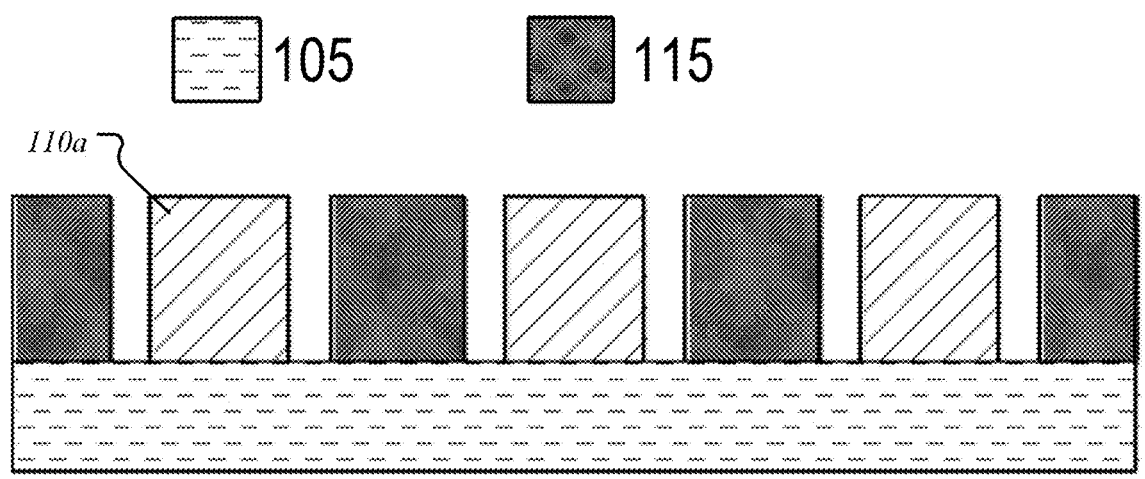
FIG. 2D is a cross-sectional substrate segment illustrating development results, according to an embodiment of the present disclosure.

FIG. 2D is a cross-sectional substrate segment illustrating development results, according to an embodiment of the present disclosure. In an embodiment, having a high developer dissolution rate for the upper high solubility resin/polymer 125 film can uncover the area of the lower resin/polymer 115 film that has been reacted with diffused acid to form the developer-soluble anti-spacer regions 120. The polymer remaining in the lower film now requires no intrinsic or unexposed developer solubility, and more attention can be focused on other properties, such as etch selectivity. Another advantage of the main polymer in the lower resin/polymer 115 film having no developer solubility is to improve across-wafer uniformity. Having the bilayer polymer film system with the upper, developer-soluble high solubility resin/polymer 125 covering a little more than the overburden portion of the overcoat 115a enables some inherent self-correction with across-wafer non-uniformities. After the upper film is removed, the soluble anti-spacers can also be removed.

Other process flow steps described herein can be similar to those in a rate-selective flow process for anti-spacer formation, and no additional steps are required. The first resist including an additional acid source can be coated and imaged. The second formulation including the polymer bilayer system can be coated on top of the first layer image. This formulation can be coated from a solvent that does not dissolve the first layer pattern and can include, but is not limited to, MIBC (methyl isobutyl carbitol). The second formulation can optionally include solvents that promote the segregation of the two polymers that are present. The lower surface energy polymer can include fluorinated moieties or long alkyl chain functionality to promote the surface energy difference. The lower surface energy polymer can also include acidic functionality to promote the efficient dissolution in developer. Promoting segregation over topography to form the overburden provides improvements herein. The main polymer in the lower layer can be any polymer of similar chemistry to the first layer patterned resist, preferably with functionality that promotes similar etch selectivity. The main polymer can include a switchable component that de-protects (changes a solubility) at a lower activation energy than the first layer polymer. The newly soluble region can be soluble in a solvent that does not dissolve the first layer pattern.

In an embodiment, after the deposition of the polymer bilayer film, a bake step can be performed to generate and diffuse the acid into the lower layer polymer where a deprotection step switches the solubility of the main polymer. A subsequent develop step can remove the high dissolution rate overburden layer and the area deprotected by the acid diffusion bake. After the develop step, trenches and lines have been created from the lower layer film. The new pattern with smaller trenches can now be transferred into the underlayer.

Advantageously, the polymer bilayer film system herein improves across-wafer uniformity in comparison to a single polymer overcoat in the anti-spacer process flow. In the polymer bilayer system, the overburden can be a different material to the side wall, and the lower polymer in the polymer bilayer system does not require solubility in, for example, TMAH. As can be appreciated, various polymers and compositions can be selected for forming the polymer bilayer system. Depending on polymers and solvent systems selected, the upper layer can have different heights. A given overburden height and time to clear out the anti-spacer trench can thus define a corresponding development time. Increasing development time can widen anti-spacer trenches, while low dissolution rates can provide a greater process window.

Figure 3A:
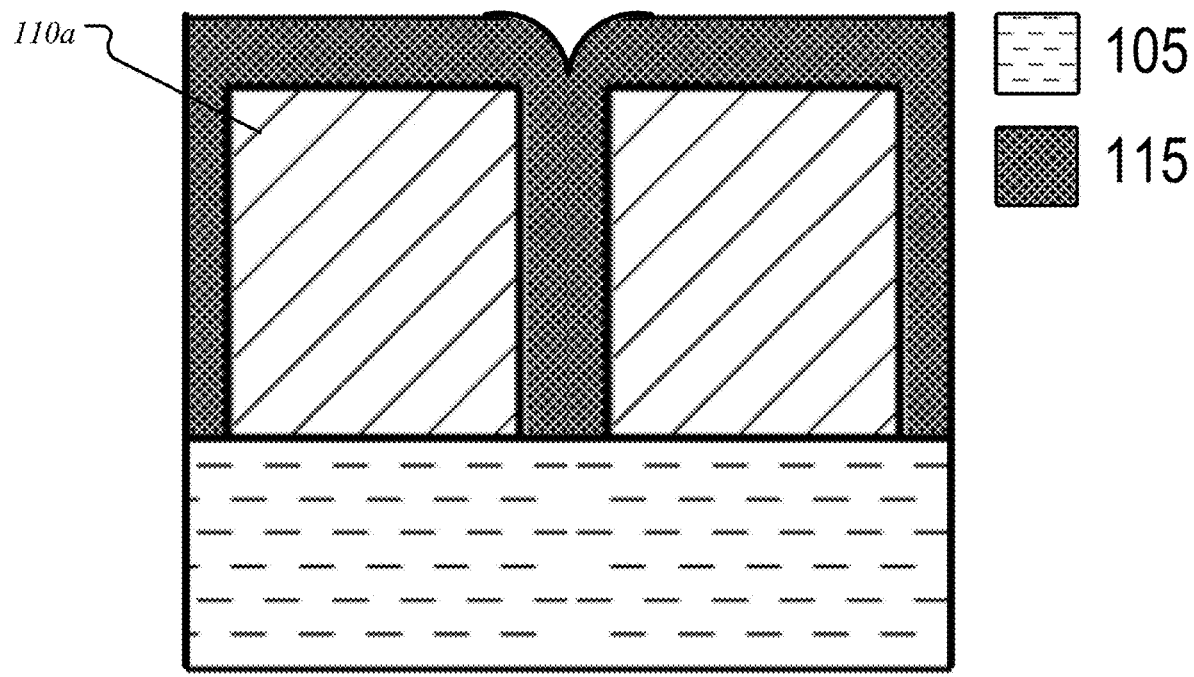
FIG. 3A is a cross-sectional substrate segment illustrating a single polymer overcoat, according to an embodiment of the present disclosure.
Figure 3B:
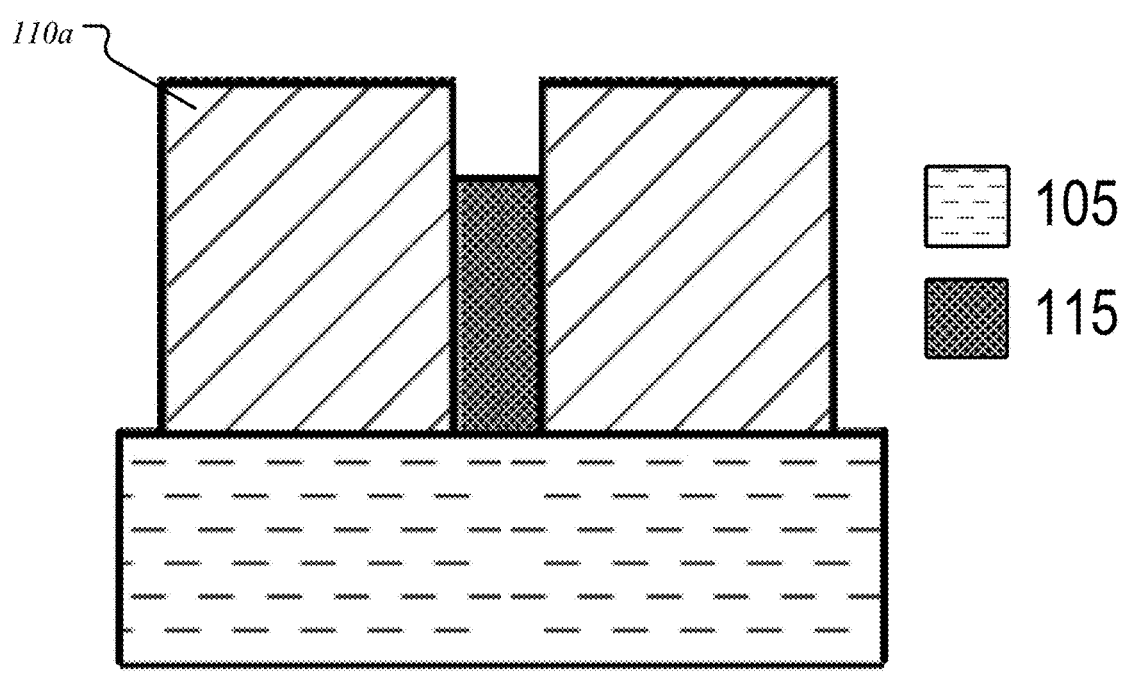
FIG. 3B is a cross-sectional substrate segment illustrating the single polymer overcoat recessed, according to an embodiment of the present disclosure.

To this end, FIG. 3A is a cross-sectional substrate segment illustrating a single polymer overcoat, according to an embodiment of the present disclosure. FIG. 3B is a cross-sectional substrate segment illustrating the single polymer overcoat recessed, according to an embodiment of the present disclosure. In an embodiment, there are many fabrications stages in which a partial fill of a trench or opening is desired. Some processes can include depositing the single polymer overcoat 115a, and then executing an etch step to remove the overburden and recess the material. This type of etch may not have an etch stop layer, and so etch duration is used to estimate the recess amount, which can have poor control. Atomic layer etching can be used, but this can increase cost and reduce throughput.

Figure 4A:
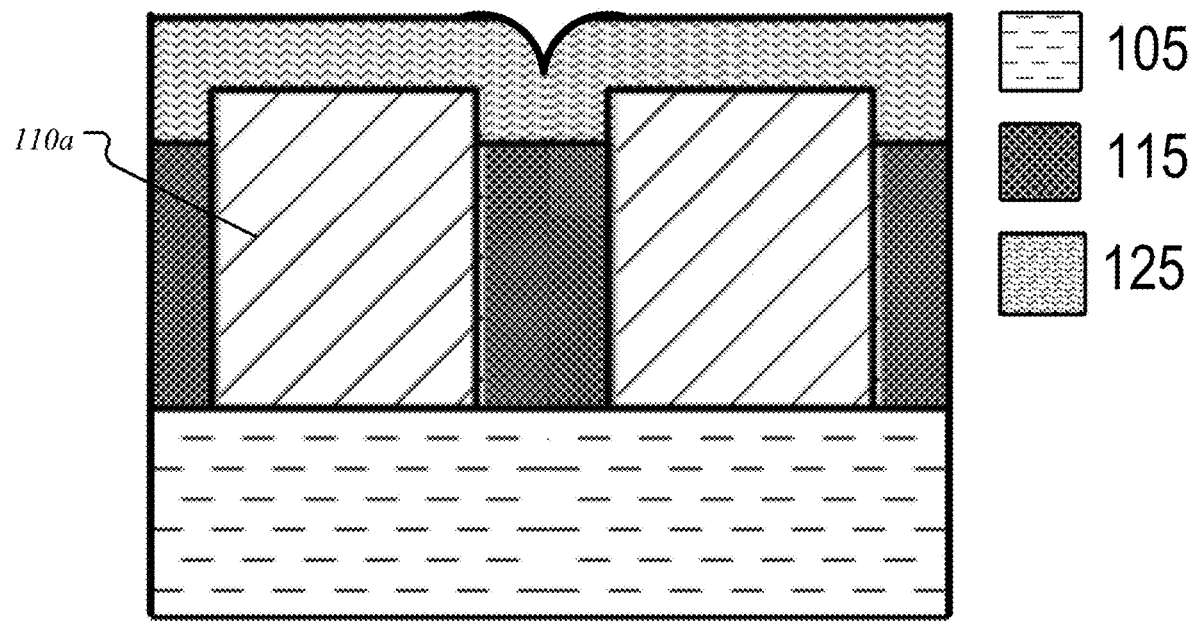
FIG. 4A is a cross-sectional substrate segment illustrating the polymer bilayer film system, according to an embodiment of the present disclosure.
Figure 4B:
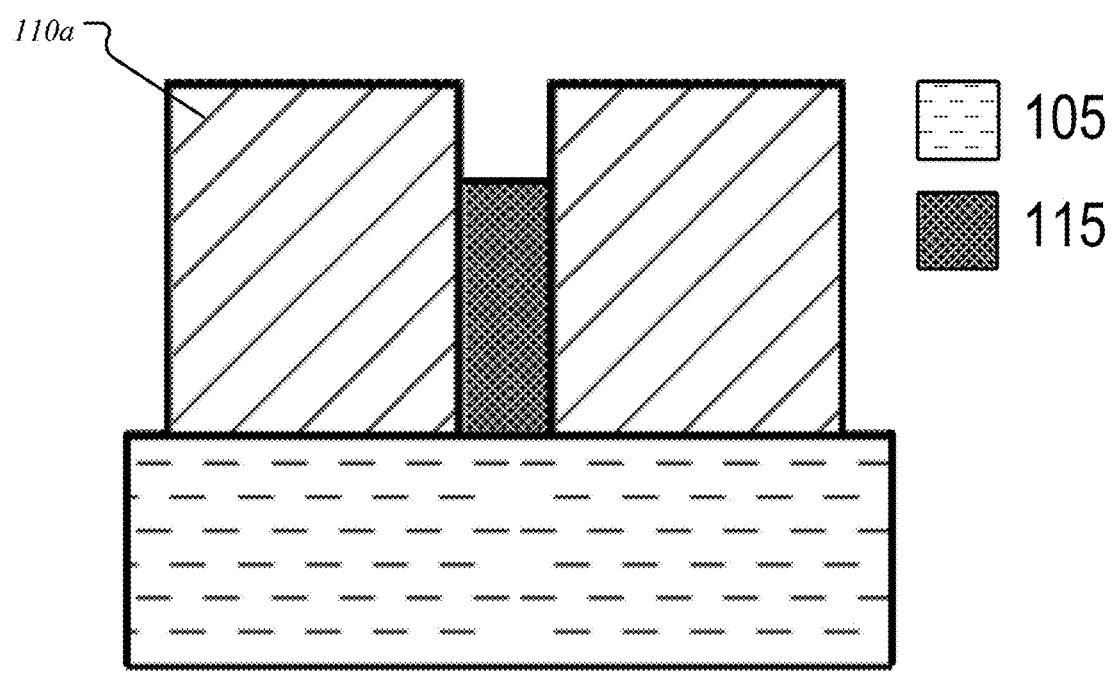
FIG. 4B is a cross-sectional substrate segment illustrating the polymer bilayer film system recessed, according to an embodiment of the present disclosure.

As such, FIG. 4A is a cross-sectional substrate segment illustrating the polymer bilayer film system, according to an embodiment of the present disclosure. FIG. 4B is a cross-sectional substrate segment illustrating the polymer bilayer film system recessed, according to an embodiment of the present disclosure. In an embodiment, polymer mixtures can be selected to be soluble in different developers, and self-segregates or self-assembles into at least two layers. The upper film (high solubility resin/polymer 125) can fill the overburden region and part of the openings. The upper film can be removed with a particular solvent that does not dissolve the lower film (the resin/polymer 115) or at least has a dissolution rate significantly slower such that the upper film can be removed while the lower film remains.

Figure 5:
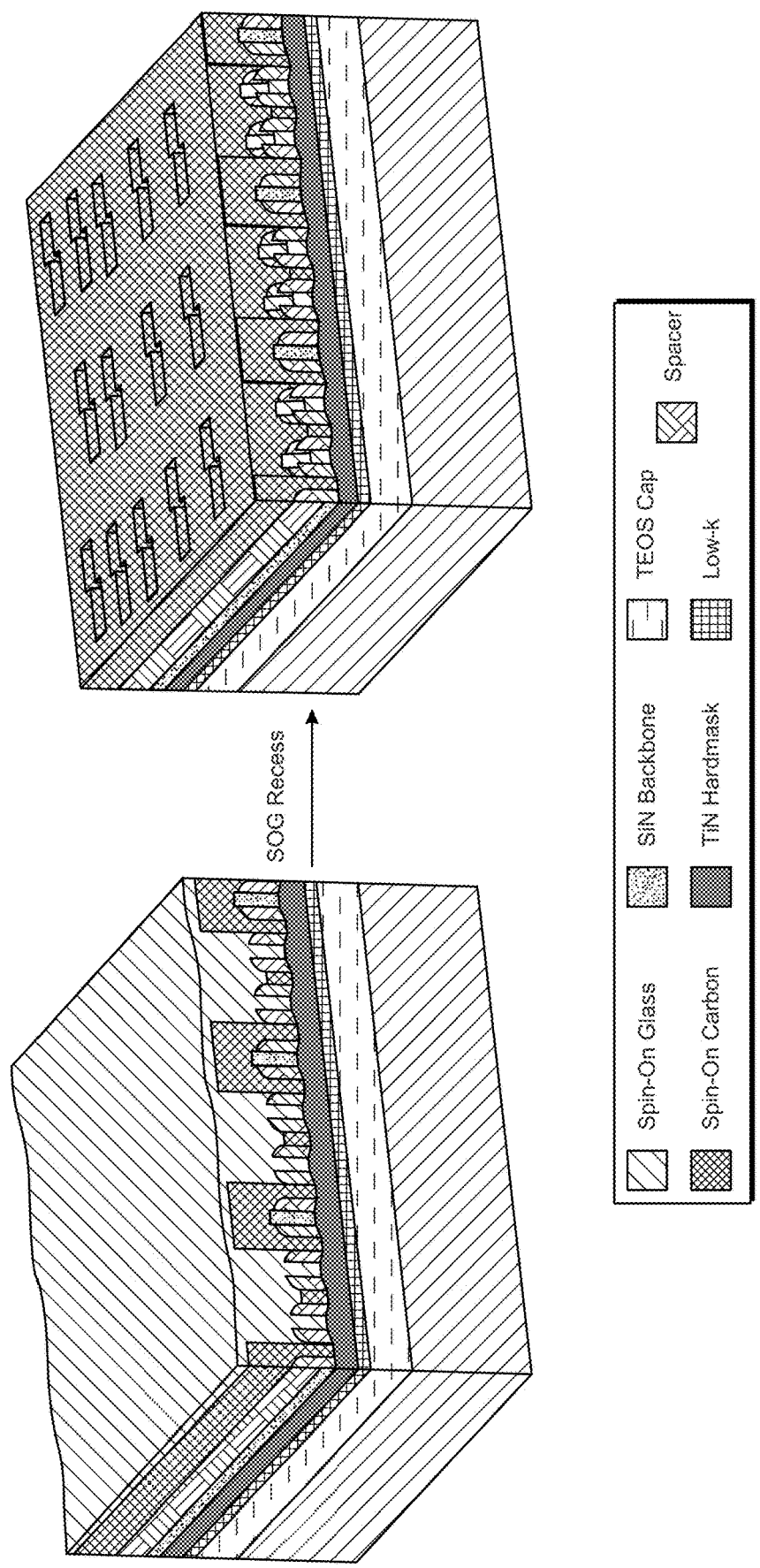
FIG. 5 is a perspective substrate segment illustrating the deposited polymer bilayer film system, according to an embodiment of the present disclosure.

As can be appreciated, there can be several applications in which a recessed trench fill is desired. By way of a non-limiting example, one application includes forming a recess with spin-on glass. FIG. 5 is a perspective substrate segment illustrating the deposited polymer bilayer film system, according to an embodiment of the present disclosure. In FIG. 5 on the left, precise recess between the spacers is desired. A polymer mixture can be deposited on a substrate with features/openings. The polymer mixture can segregate to a precise depth within the trench and then be removed by a spin-on solvent rinse. One advantage of this bilayer recess is implementation on a track tool (coater-developer tool) for increasing throughput. In some recess applications, the polymer bilayer film system can be a pre-defined alternative to bottom-growth that does not rely on substrate or side wall selectivity. Note that bilayer segregation herein is not limited to soft materials, and any type of spin-on material mixture that supports self-segregation can be used.

In summary, the bilayer overcoat film allows a high throughput method for the formation of a controlled thickness of overburden that can be removed to form a planar surface or precisely tuned recess. During the anti-spacer application, the overcoat polymer that segregates to the surface has a high developer solubility. A develop step can quickly remove the top polymer that forms the overburden, thus exposing the deprotected polymer below and a trench is formed. The protected acid labile overcoat polymer on the bottom of the bilayer requires no developer solubility which enhances across-wafer CD uniformity and allows for improved polymer functionality.

Figure 6:
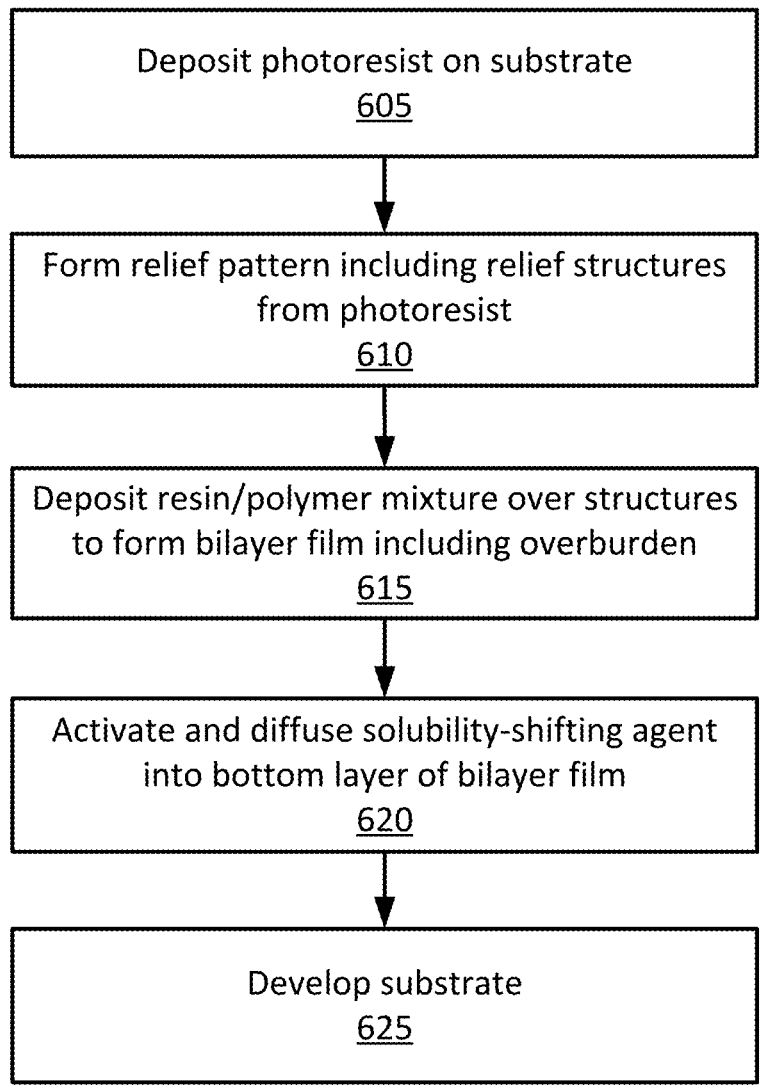
FIG. 6 is a flow chart for a method of patterning a substrate, according to an embodiment of the present disclosure.

FIG. 6 is a flow chart for a method 600 of patterning a substrate, according to an embodiment of the present disclosure.

Step 605 is depositing a first layer of photoresist on the substrate.

Step 610 is forming a relief pattern from the first layer of photoresist, the first layer of photoresist including a first solubility-shifting agent and a second solubility-shifting agent, the photoresist having a sensitivity to the first solubility-shifting agent and the second solubility-shifting agent, the relief pattern formed by activating the first solubility-shifting agent using a pattern of actinic radiation and developing the first layer of photoresist.

Step 615 is depositing a resin or polymer mixture on the relief structures, the resin/polymer mixture filling openings defined by the relief pattern and covering the relief structures, a region above top surfaces of the relief structures being an overburden region, the resin/polymer mixture including a first resin/polymer and a second resin/polymer, the resin/polymer mixture being configured to self-segregate relative to gravity such that a first film and a second film are formed from the resin/polymer mixture, the first film including the first resin/polymer formed below the second film including the second resin/polymer, the first film and the second film formed such that the second film fills the overburden region, the first film being sensitive to the second solubility-shifting agent and having a threshold of sensitivity that is less than a threshold of sensitivity of the photoresist, the second film being soluble to a first developer.

Step 620 is activating the second solubility-shifting agent and diffusing the second solubility-shifting agent a predetermined diffusion length from the relief structures into the first film, the second solubility-shifting agent activated sufficiently to meet the threshold of sensitivity of the first film without meeting the threshold of sensitivity of the photoresist, diffusion regions formed in the first film becoming soluble to the first developer while the photoresist remains insoluble to the first developer.

Step 625 is developing the substrate to remove the second film and the soluble diffusion regions of the first film.

A method of patterning a substrate includes forming a relief pattern including relief structures on a substrate from a first layer of photoresist on the substrate, the first layer of photoresist including a first solubility-shifting agent and a second solubility-shifting agent, the photoresist having a sensitivity to the first solubility-shifting agent and the second solubility-shifting agent, the relief pattern formed by activating the first solubility-shifting agent using a pattern of actinic radiation and developing the first layer of photoresist; depositing a polymer mixture on the relief structures, the polymer mixture filling openings defined by the relief pattern and covering the relief structures, a region above top surfaces of the relief structures being an overburden region, the polymer mixture including a first polymer and a second polymer, the polymer mixture being configured to self-segregate relative to gravity such that a first film and a second film are formed from the polymer mixture, the first film including the first polymer formed below the second film including the second polymer, the first film and the second film formed such that the second film fills the overburden region, the first film being sensitive to the second solubility-shifting agent and having a threshold of sensitivity that is less than a threshold of sensitivity of the photoresist, the second film being soluble to a first developer; activating the second solubility-shifting agent and diffusing the second solubility-shifting agent a predetermined diffusion length from the relief structures into the first film, the second solubility-shifting agent activated sufficiently to meet the threshold of sensitivity of the first film without meeting the threshold of sensitivity of the photoresist, diffusion regions formed in the first film becoming soluble to the first developer while the photoresist remains insoluble to the first developer; and developing the substrate to remove the second film and the soluble diffusion regions of the first film.

In an embodiment, the polymer mixture is deposited via spin-coating deposition.

In an embodiment, the polymer mixture self-segregates upon being deposited on the substrate.

In an embodiment, the second film extends below the top surfaces of the relief structures upon self-segregating.

In an embodiment, the polymer mixture self-segregates in response to heat and the method further comprises performing a thermal bake after depositing the polymer mixture on the relief structures.

In an embodiment, developing the substrate further comprises developing the substrate with the first developer to remove the second film and the soluble diffusion regions of the first film.

In an embodiment, the second film is soluble to a second developer, and developing the substrate further comprises developing the substrate with the second developer to remove the second film before developing the substrate with the first developer to remove the soluble diffusion regions of the first film.

In an embodiment, the second film is removed after activating the second solubility shifting agent.

In an embodiment, the second film is removed before activating the second solubility shifting agent.

In an embodiment, a material of the second polymer includes HFIP-M, MA-MIB-HFA, MA-BTHB-OH, MA-3,5-HFA-CHOH, MA-BTHB-NB, MA-EATf, and MA-DM-EATf.

A method of patterning a substrate includes forming a relief pattern including relief structures on a substrate from a first layer of photoresist on the substrate, the first layer of photoresist including a first solubility-shifting agent and a second solubility-shifting agent, the photoresist having a sensitivity to the first solubility-shifting agent and the second solubility-shifting agent, the relief pattern formed by activating the first solubility-shifting agent using a pattern of actinic radiation and developing the first layer of photoresist; depositing a resin overcoat on the relief structures, the resin overcoat filling openings defined by the relief pattern and covering the relief structures, a region above top surfaces of the relief structures being an overburden region, the resin overcoat having a resin mixture including a first resin and a second resin, the resin overcoat being configured to self-segregate relative to gravity such that a first film and a second film are formed from the resin overcoat, the first film including the first resin formed below the second film including the second resin, the first film and the second film formed such that the second film fills the overburden region, the first film being sensitive to the second solubility-shifting agent and having a threshold of sensitivity that is less than a threshold of sensitivity of the photoresist, the second film being soluble to a first developer; activating the second solubility-shifting agent and diffusing the second solubility-shifting agent a predetermined diffusion length from the relief structures into the first film, the second solubility-shifting agent activated sufficiently to meet the threshold of sensitivity of the first film without meeting the threshold of sensitivity of the photoresist, diffusion regions formed in the first film becoming soluble to the first developer while the photoresist remains insoluble to the first developer; and developing the substrate to remove the second film and the soluble diffusion regions of the first film.

In an embodiment,

In an embodiment, the resin overcoat is deposited via spin-coating deposition.

In an embodiment, wherein the resin overcoat self-segregates upon being deposited on the substrate.

In an embodiment, the second film extends below the top surfaces of the relief structures upon self-segregating.

In an embodiment, the resin overcoat self-segregates in response to heat and the method further comprises performing a thermal bake after depositing the resin overcoat on the relief structures.

In an embodiment, developing the substrate further comprises developing the substrate with the first developer to remove the second film and the soluble diffusion regions of the first film.

In an embodiment, the second film is soluble to a second developer, and developing the substrate further comprises developing the substrate with the second developer to remove the second film before developing the substrate with the first developer to remove the soluble diffusion regions of the first film.

In an embodiment, the second film is removed after activating the second solubility shifting agent.

In an embodiment, the second film is removed before activating the second solubility shifting agent.

A method of patterning a substrate includes receiving a substrate having features defining openings to be partially filled; depositing a polymer mixture on the substrate, the polymer mixture filling openings defined by the features and covering the features, a region above top surfaces of the features being an overburden region, the polymer mixture including a first polymer and a second polymer, the polymer mixture being configured to self-segregate relative to gravity such that a first film and a second film are formed from the polymer mixture, the first film including the first polymer formed below the second film including the second polymer, the first film and the second film formed such that the first film partially fills the defined openings while the second film fills remaining portions of the defined openings and fills the overburden region, the second film being sensitive to a particular solvent while the first film is insoluble to the particular solvent; and developing the substrate with the particular solvent to remove the second film, the first film remaining in the defined openings.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of patterning a substrate, comprising:

forming a relief pattern including relief structures on a substrate from a first layer of photoresist on the substrate, the first layer of photoresist including a first solubility-shifting agent and a second solubility-shifting agent, the photoresist having a sensitivity to the first solubility-shifting agent and the second solubility-shifting agent, the relief pattern formed by activating the first solubility-shifting agent using a pattern of actinic radiation and developing the first layer of photoresist;

depositing a polymer mixture on the relief structures, the polymer mixture filling openings defined by the relief pattern and covering the relief structures, a region above top surfaces of the relief structures being an overburden region, the polymer mixture including a first polymer and a second polymer, the polymer mixture being configured to self-segregate relative to gravity such that a first film and a second film are formed from the polymer mixture, the first film including the first polymer formed below the second film including the second polymer, the first film and the second film formed such that the second film fills the overburden region, the first film being sensitive to the second solubility-shifting agent and having a threshold of sensitivity that is less than a threshold of sensitivity of the photoresist, the second film being soluble to a first developer;

activating the second solubility-shifting agent and diffusing the second solubility-shifting agent a predetermined diffusion length from the relief structures into the first film, the second solubility-shifting agent activated sufficiently to meet the threshold of sensitivity of the first film without meeting the threshold of sensitivity of the photoresist, diffusion regions formed in the first film becoming soluble to the first developer while the photoresist remains insoluble to the first developer; and developing the substrate to remove the second film and the soluble diffusion regions of the first film.

2. The method of claim 1, wherein the polymer mixture is deposited via spin-coating deposition.

3. The method of claim 1, further comprising self-segregating the polymer mixture upon being deposited on the substrate.

4. The method of claim 3, wherein the second film extends below the top surfaces of the relief structures upon self-segregating.

5. The method of claim 3, wherein the polymer mixture is self-segregated in response to performing a thermal bake.

6. The method of claim 1, wherein developing the substrate further comprises developing the substrate with the first developer to remove the second film and the soluble diffusion regions of the first film.

7. The method of claim 1, wherein
the second film is soluble to a second developer, and
developing the substrate further comprises developing the substrate with the second developer to remove the second film before developing the substrate with the first developer to remove the soluble diffusion regions of the first film.

8. The method of claim 7, wherein the second film is removed after activating the second solubility shifting agent.

9. The method of claim 7, wherein the second film is removed before activating the second solubility shifting agent.

10. A method of patterning a substrate, comprising:
forming a relief pattern including relief structures on a substrate from a first layer of photoresist on the substrate, the first layer of photoresist including a first solubility-shifting agent and a second solubility-shifting agent, the photoresist having a sensitivity to the first solubility-shifting agent and the second solubility-shifting agent, the relief pattern formed by activating the first solubility-shifting agent using a pattern of actinic radiation and developing the first layer of photoresist;
depositing a resin overcoat on the relief structures, the resin overcoat filling openings defined by the relief pattern and covering the relief structures, a region above top surfaces of the relief structures being an overburden region, the resin overcoat having a resin mixture including a first resin and a second resin, the resin overcoat being configured to self-segregate relative to gravity such that a first film and a second film are formed from the resin overcoat, the first film including the first resin formed below the second film including the second resin, the first film and the second film formed such that the second film fills the overburden region, the first film being sensitive to the second solubility-shifting agent and having a threshold of sensitivity that is less than a threshold of sensitivity of the photoresist, the second film being soluble to a first developer;

activating the second solubility-shifting agent and diffusing the second solubility-shifting agent a predetermined diffusion length from the relief structures into the first film, the second solubility-shifting agent activated sufficiently to meet the threshold of sensitivity of the first film without meeting the threshold of sensitivity of the photoresist, diffusion regions formed in the first film becoming soluble to the first developer while the photoresist remains insoluble to the first developer; and developing the substrate to remove the second film and the soluble diffusion regions of the first film.

11. The method of claim 10, wherein the resin overcoat is deposited via spin-coating deposition.

12. The method of claim 10, further comprising self-segregating the resin overcoat upon being deposited on the substrate.

13. The method of claim 12, wherein the second film extends below the top surfaces of the relief structures upon self-segregating.

14. The method of claim 12, wherein the resin overcoat is self-segregated in response to performing a thermal bake.

15. The method of claim 10, wherein developing the substrate further comprises developing the substrate with the first developer to remove the second film and the soluble diffusion regions of the first film.

16. The method of claim 10, wherein
the second film is soluble to a second developer, and
developing the substrate further comprises developing the substrate with the second developer to remove the second film before developing the substrate with the first developer to remove the soluble diffusion regions of the first film.

17. The method of claim 16, wherein the second film is removed after activating the second solubility shifting agent.

18. The method of claim 16, wherein the second film is removed before activating the second solubility shifting agent.

* * * * *